(12) United States Patent
Monge

(10) Patent No.: US 9,018,748 B2
(45) Date of Patent: Apr. 28, 2015

(54) POWER SEMICONDUCTOR HOUSING WITH CONTACT MECHANISM

(71) Applicant: Mauro Monge, Vasteras (SE)

(72) Inventor: Mauro Monge, Vasteras (SE)

(73) Assignee: ABB Technology AG (CH)

( * ) Notice: Subject to any disclaimer, the term of this patent is extended or adjusted under 35 U.S.C. 154(b) by 0 days.

(21) Appl. No.: 14/139,194

(22) Filed: Dec. 23, 2013

(65) Prior Publication Data

US 2014/0145321 A1 May 29, 2014

Related U.S. Application Data

(63) Continuation of application No. PCT/EP2011/060279, filed on Jun. 21, 2011.

(51) Int. Cl.
| | |
|---|---|
| *H01L 23/16* | (2006.01) |
| *H01L 23/58* | (2006.01) |
| *H01L 23/00* | (2006.01) |
| *H01H 79/00* | (2006.01) |
| *H01L 23/04* | (2006.01) |
| *H01L 25/07* | (2006.01) |

(Continued)

(52) U.S. Cl.
CPC ............ *H01L 23/562* (2013.01); *H01H 79/00* (2013.01); *H01L 23/04* (2013.01); *H01L 25/074* (2013.01); *H01L 25/115* (2013.01); *H01L 2924/13055* (2013.01); *H01L 2924/16151* (2013.01); *H01L 2924/17151* (2013.01); *H02M 7/003* (2013.01); *H01H 39/004* (2013.01); *H03K 17/107* (2013.01); *H01L 2924/0002* (2013.01)

(58) Field of Classification Search
USPC .................................... 257/683, 678, E23.194
See application file for complete search history.

(56) References Cited

U.S. PATENT DOCUMENTS 4,099,201 A * 7/1978 Mueller ..................... 257/683
4,150,394 A * 4/1979 Sugawa et al. ............. 257/689

(Continued)

FOREIGN PATENT DOCUMENTS

WO 2010081555 A1 7/2010

OTHER PUBLICATIONS

International Preliminary Report on Patentability Application No. PCT/EP2011/060279 Completed: Oct. 14, 2013 17 pages.

(Continued)

*Primary Examiner* — Nitin Parekh
(74) *Attorney, Agent, or Firm* — St. Onge Steward Johnston & Reens LLC

(57) ABSTRACT

A housing for a power semiconductor, providing a compartment for installation of a power semiconductor, and including a first and a second terminal. The terminals are for connection of a power semiconductor installed in the compartment, and for leading current to and from the compartment. The housing includes a contact mechanism for bypassing the compartment, the contact mechanism including at least one movable contact arranged for electrically connecting the first and second terminal, the at least one movable contact being movable between a disconnected first position and a connected second position. The contact mechanism further includes a bypass actuator arranged inside the compartment and provided for transforming a pressure from an exploding semiconductor into motion, the bypass actuator is operatively connected to the movable contact and arranged to move the movable contact from the first to the second position when subjected to the pressure of an exploding semiconductor.

14 Claims, 4 Drawing Sheets

(51) Int. Cl.
*H01L 25/11* (2006.01)
*H02M 7/00* (2006.01)
*H01H 39/00* (2006.01)
*H03K 17/10* (2006.01)

(56) References Cited

U.S. PATENT DOCUMENTS

| | | | | |
|---|---|---|---|---|
| 4,162,514 | A | * | 7/1979 | De Bruyne et al. ............... 361/2 |
| 4,274,106 | A | * | 6/1981 | Ohdate ........................ 257/683 |
| 4,399,452 | A | * | 8/1983 | Nakashima et al. .......... 257/689 |
| 6,222,284 | B1 | | 4/2001 | Hammond et al. |
| 6,295,205 | B1 | | 9/2001 | Lang et al. |
| 2009/0141416 | A1 | | 6/2009 | Dommaschk et al. |
| 2009/0250799 | A1 | | 10/2009 | Billmann et al. |
| 2009/0257165 | A1 | | 10/2009 | Dorn |
| 2010/0118453 | A1 | | 5/2010 | Dorn et al. |
| 2010/0314775 | A1 | | 12/2010 | Schwarzbauer |

OTHER PUBLICATIONS

International Search Report and Written Opinion of the International Searching Authority Application No. PCT/EP2011/060279 Completed: Feb. 28, 2012; Mailing Date: Mar. 6, 2012 12 pages.

Written Opinion of the International Preliminary Examining Authority Application No. PCT/EP2011/060279 Mailing Date: Jul. 5, 2013 5 pages.

* cited by examiner

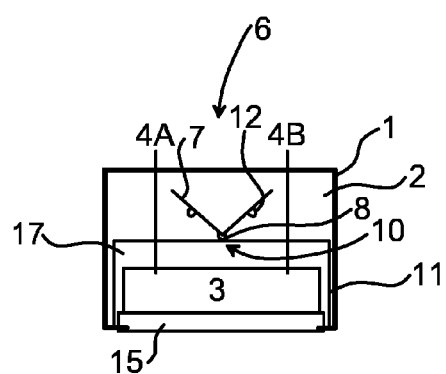 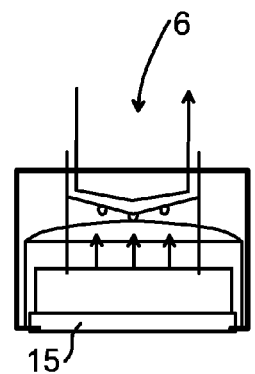
Fig. 3a    Fig. 3b
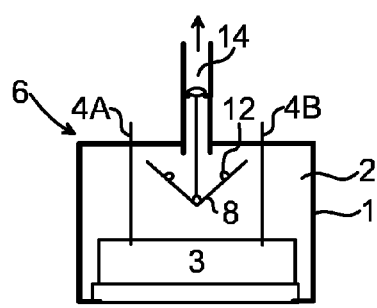 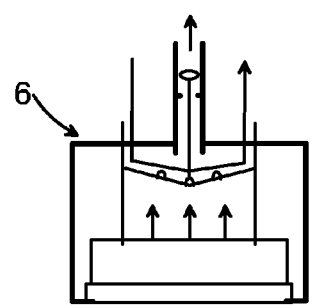
Fig. 4a    Fig. 4b

POWER SEMICONDUCTOR HOUSING WITH CONTACT MECHANISM

FIELD OF THE INVENTION

The invention relates to electrical power systems comprising power semiconductors and especially for protection against damage and malfunctioning caused by exploding power semiconductors.

BACKGROUND OF THE INVENTION

The invention relates protection against damage and malfunctioning caused by exploding power semiconductors. Especially, the invention relates to installations for bypassing an exploded power semiconductor, such as an IGBT.

Power semiconductors, such as IGBTs (Insulated Gate Bipolar Transistor) or GTOs (Gate Turnoff Thyristor), are used in the field of power transmission systems for converting electrical current. In such systems, a series of modules comprising a semiconductor may be arranged in branch, one for each phase, of a converter. Such converters are used for conversion between AC and DC. In the event of a malfunctioning semiconductor, such systems have been adapted to bridge or bypass this faulty semiconductor or the installation module of the semiconductor.

US 2009/0141416 (D1, see abstract of D1) shows a device for short-circuiting power semiconductor modules. The document describes power semiconductor modules connected to each other in a series circuit. A short-circuiting device is arranged at each power semiconductor module. The short-circuiting device is a pyrotechnical/mechanical element, which has a detonation charge and a tripping device, which can be displaced by the detonation charge.

US 2009/0257165 (D2, see abstract of D2) shows a overcurrent switching apparatus for bypassing an electronic component (9 in figures), such as an IGBT, which includes a carriage (14) for a shortcircuiting contact (19) interconnecting terminals (2, 3), which carriage is driven by a prestressed spring (15).

US 2010/0118453 (D3, see claims of D3) shows an installation of power semiconductors comprising a shortcircuiting device for each semiconductor submodule. The shortcircuiting device includes a vacuum interrupter tube provided with latching and tripping means, which tripping means counteracts the latching means.

U.S. Pat. No. 6,222,284 (D4) also includes a springloaded switch and trip release device (see FIG. 1d (ii) of D4).

A problem with such bypassing devices, which includes bypassing means that are released during a failure, is that they may also be released accidently without any failure and cause unnecessary disruption of, for example, power transmission.

US 2010/0314775 (D6) describes an explosion-resistant module structure for power semiconductor components (such as IGBTs). It includes a hollow space filled with particles (5 in FIG. 1 of D&) arranged on top of a power semiconductor (1). The particles are electrically conducting spherical particles that during a short circuit conducts the current. The construction reduces the explosion pressure by providing channels for escape of explosion gas. Thus, D6 provides a protection that cannot be released accidentally.

However, the module of D6 cannot provide a reliable permanent current conducting upon a shortcircuiting failure (see §0007 of D6).

Moreover, in the field of explosion resistant installations of power semiconductors, document U.S. Pat. No. 6,295,205 (D7) describes a protective casing for a power semiconductor (such as an IGBT), which includes an expandable protective sheath for catching fragments from an exploding power semiconductor. One protective sheath is installed enclosing each power semiconductor module. The protective sheats can be made of a fabric that includes Kevlar (aramid fibers made of para-phenyien-terephthaiamide (PPTA). D7 provides a protection from high velocity fragments from an explosion, but does not describe disconnection of a faulty power semiconductor.

SUMMARY OF THE INVENTION

It is an object of the invention to overcome the shortcomings of the prior art and provide a housing for installing a power semiconductor, which housing includes means for bypassing the semiconductor if the semiconductor explodes, and which bypassing means are constructed so that accidental activation is avoided.

It is a further object to provide a reliable bypass that acts quickly upon the explosion of a semiconductor.

It is a further object to provide a bypass that securely and reliably provides a bypass for as long time as is necessary.

For these purposes, the present invention provides a housing for a power semiconductor, which housing provides a compartment for installation of a power semiconductor, and comprises a first and a second terminal, especially terminals for connection of busbar conductors. The terminals are arranged for connection of a power semiconductor installed in the compartment, and for leading current to and from the compartment. A contact mechanism for bypassing the compartment is also provided, which contact mechanism comprises at least one movable contact arranged for electrically connecting the first and second terminal. The at least one movable contact is movable between a disconnected first position and a connected second position, in which second position the movable contact connects the terminals. The contact mechanism further comprises a bypass actuator, which is arranged inside the compartment and provided for transforming a pressure from an exploding semiconductor into motion. The bypass actuator is responsive to an explosion pressure and operatively connected to the movable contact and arranged to move the movable contact from the first to the second position when subjected the pressure of an exploding semiconductor, so that the contact mechanism bypasses the housing and/or bypasses the remains of the semiconductor in the compartment.

Since it is the explosion that drives the bypass actuator, the bypass actuator is prevented from being accidentally activated, and also acts quickly as the explosion pressure acts directly on the bypass actuator.

In an embodiment, the connection between the terminals and the movable contact includes clamping means, such as springs, for holding the movable contact in the second position, in this way, a reliable contact can be maintained.

In an embodiment, the contact mechanism further comprises a signal controlled actuator for moving the movable contact between the first and second positions. In this way, the movable contact may be used also for example during installation and/or maintenance operations. The movability of the movable contact can also be easily checked.

In an embodiment, the signal controlled actuator is an electromagnetic actuator controlled by an electric signal. Such constructions are reliable and are able to act fast.

In an embodiment, the movable contact is arranged to connect to the terminals outside the housing. This makes it easier to see the bypass, and the contact surfaces may be more easily protected from damage or dirt from an explosion.

In an embodiment, the contact mechanism includes a piston member and the bypass actuator includes a surface at the end of the piston member, which surface faces the power semiconductor. Preferably, the piston member extends through the housing. Such a construction can be made easily movable and still sealing the compartment from the surrounding environment In an embodiment, the housing includes a pressure relief valve arranged for selectively realeasing gas, especially explosion gases, from the housing. In an embodiment, the contact mechanism is operatively connected to the pressure relief valve and arranged for opening the pressure relief valve when the contact mechanism connects to the terminals. When the pressure is no longer needed for moving the movable contact the valve opens. The mechanism can be designed so that a less than total explosion of the semiconductor is enough to move the movable contact to the terminals, and so that the valve limits the motion of the movable contact during a total explosion.

In an embodiment, the bypass actuator comprises an enclosure, such as a box or bag structure, for the power semiconductor, which enclosure is adapted for being arranged inside the compartment as a housing for the power semiconductor. In an embodiment, the enclosure consists of an expandable material and being adapted for structural expansion when subjected to the explosion pressure of the power semiconductor. Thus, the explosion materials may be kept inside the enclosure, and the expansion and/or movement of the enclosure move the movable contact. The enclosure can suitably be dimensioned for a maximum explosion, wherein ail the material of the semiconductor explodes and provide a limit to the motion imparted to the movable contact. Especially, the expanding volume provides the possibility to control the range of a translatory movement of the movable contact within suitable limits.

In an embodiment, the housing comprises at least one guiding element for controlling the movement of the movable contact, such as a hinge controlling a rotational movement of the movable contact, or an elongated element controlling a translational movement of the movable contact. In this way, the movement is controlled and surge for reliability.

The invention also provides an electric power converting system comprising a plurality of housings, each with an installation compartment with a power semiconductor, which housings are arranged in series.

A preferred embodiment of the electric power converting system comprises three branches of the serially arranged semiconductor housings.

BRIEF DESCRIPTION OF THE DRAWINGS

The invention will in the following be described in more detail with reference to the accompanying drawings, which are illustrating the invention for facilitating performing of the invention and therefore are simplified. The figures are not drawn to scale.

FIG. 1 illustrates a first embodiment of the housing 1 according to the present invention, wherein

FIGS. 3a and 3b illustrate a second embodiment of the housing 1 according to the present invention, FIGS. 4a and 4b illustrate a third embodiment of the housing 1 according to the present invention.

DETAILED DESCRIPTION OF THE INVENTION

Figure 1A:
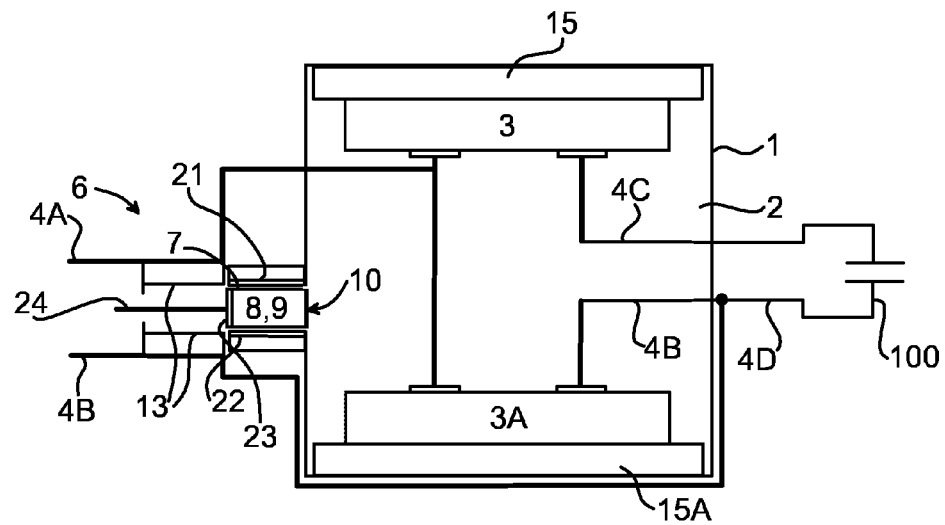
FIG. 1A illustrates a working position with a connected semiconductor.
Figure 1B:
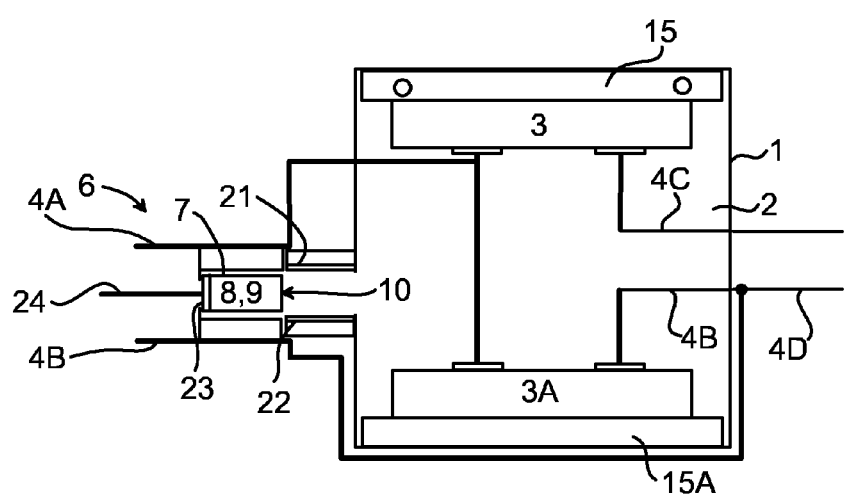
FIG. 1B illustrates a bypass position in which the housing module is bypassed.

FIG. 1a and FIG. 1b illustrates a first embodiment of the housing 1 according to the present invention. The housing 1 surrounds a compartment 2 with mounting plates 15, 15A for installation of a respective power semiconductor 3, 3A. The power semiconductor device 3, 3A is referred to as a "power semiconductor" but may include other components, such as is known in the art and which device includes least one power semiconductor switch, such as an IGBT, or GTO. The installations of FIGS. 1A and 1B include two power semiconductors 3, 3A. The housing 1 is provided with terminals 4A, 4B, 4C for leading electrical currents to and from each of the power semiconductors 3, 3A. The housing includes two terminals 4A, 4B arranged for leading current into and out of the housing 1, each terminal 4A, 4B having one end outside the housing, for connecting to a busbar conductor of, for example, a converter system. Each terminal 4A, 4B extends into the housing 1 and has a second end inside the housing 1 connected to a respective contact of a semiconductor 3, in the figure a contact of a respective semiconductor 3, 3A. Alternatively, each terminal 4A,4B may in this embodiment be connected to a respective mounting plate 15, 15A, in this embodiment, and each respective mounting plate 15, 15A being provided with a respective contact for the power semiconductor 3, 3A. A third terminal 4C is included in the FIGS. 1A, 1B which connects the first power semiconductor 3 to an energy storage capacitor 100.

FIG. 1, as well as FIG. 2, illustrates embodiments wherein two semiconductors are installed in the same housing, however, it is also preferred to only have one semiconductor in such a housing, in which case the third terminal 4C is omitted and the first terminal 4A is lead into the housing providing an input for the power semiconductor, and the second terminal 4B is lead out of the housing and provides an output for the power semiconductor. FIGS. 3 and 4 illustrate further embodiments of housings 1 for installing a single power semiconductor 3.

The housing 1 of FIGS. 1A, 1B further includes a contact mechanism 6 for bypassing the housing 1. The contact mechanism 6, of FIGS. 1A, 1B, is arranged to enable interconnection of the first 4A and second terminal 4B outside the housing so that the compartment 2, and the semiconductors 3, 3A installed in the compartment 2 are bypassed by means of the contact mechanism 6. For this purpose the contact mechanism 6 includes a movable contact 7 that is movable between a first and a second position. The first position of the movable contact 7 is illustrated in FIG. 1A, wherein the movable contact 7 is disconnected from both terminals 4a, 4B. Alternatively, the movable contact 7 is disconnected from at least one of the terminals so that the terminals 4A, 4B are not connected to each other in the disconnected first position. The second position of the movable contact 7 is illustrated in FIG. 1B, wherein the movable contact 7 is in contact with contact surfaces 13 of each of the terminals 4a, 4B so that the input terminal 4A is electrically connected to output terminal 4B, whereby the housing 1 is bypassed. The contact surfaces 13 may be internal surfaces of a cylindrical tube in which the movable contact is moved, which contact surfaces 13 is electrically connected to a respective one of the terminals 4A, 4B.

For effectuating the movement of the movable contact 7 from the first position of FIG. 1A, to the second position of FIG. 1B the contact mechanism 8 comprises a bypass actuator 8. The bypass actuator 8 consists of a piston member 9 movable arranged in the housing 1 and an explosion pressure experiencing surface 10, which surface 10 is the bottom surface 10 of the piston member 9. The piston member 9 extends through the housing 1 and exposes the bottom surface 10 inside the compartment 2, and the envelope surface of the piston member 9 is arranged and guided in a tubular aperture of the housing 2. The housing 1 is essentially sealed from the outside environment so that air or gas inside the compartment may not, or only slowly, permeate out through the housing to the surroundings. If one of the power semiconductors explodes, a highly increased pressure will develop suddenly inside the housing 1. The surface 10 of the bypass actuator that is arranged inside the housing will be subjected to the increased pressure and the bypass actuator 8 will move out from the housing 1.

In the embodiments of FIGS. 1A, and 1B, the movable contact 7 constitutes an integral part of the bypass actuator 8, e.g. the piston 9 is provided with contact surface 7 at its envelope surface and/or at its surface (23) opposite the surface 10 of the bypass actuator 8 being exposed to the explosion pressure. In the illustrated embodiment, the end surface (23) opposite the explosion pressure experiencing surface 10 is provided with an insulation layer 23. The movable contact 7 will upon an explosion inside the compartment be moved into the second position establishing contact with both terminals 4A, 4B.

Thus, the invention of FIG. 1 (as well as of FIGS. 3 and 4) provides a bypassing mechanism that passively reacts to an explosion, do not need any control signals to function, and also is constructed to not erroneously provide a bypass, since bypassing is only dependent on the pressure of the compartment 2. Also FIG. 2 describes an embodiment not needing a control signal and which reacts passively to an explosion. However, the embodiment of FIG. 2 also includes a controllable mechanism.

Figure 2A:
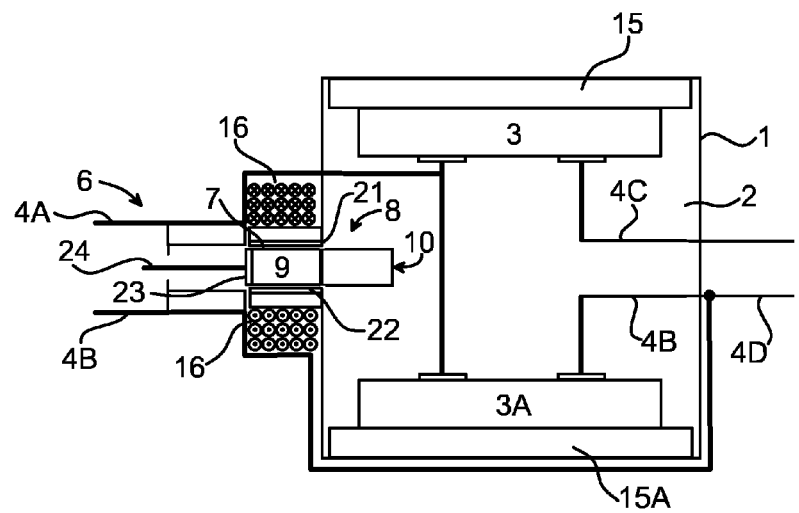
FIGS. 2a and 2b illustrate a further embodiment of the housing of FIG. 1 according to the present invention.
Figure 2B:
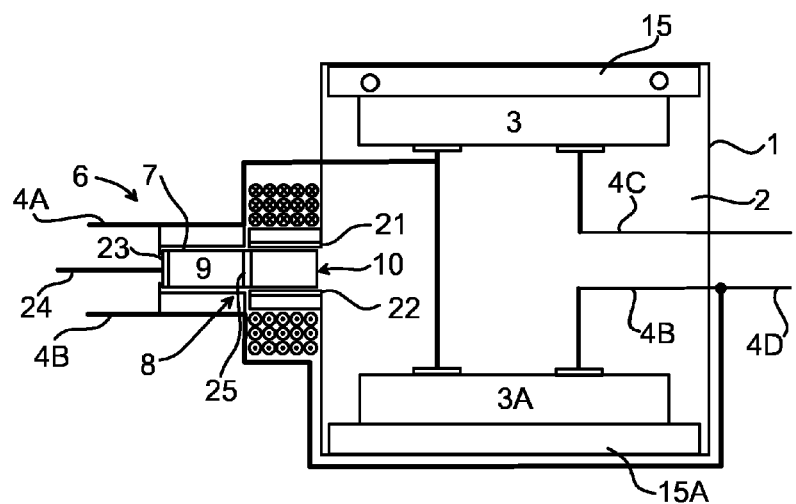

FIG. 2 illustrates a further embodiment of the housing of FIG. 1. FIGS. 2A, 2B shows the same housing and bypassing mechanism as in FIGS. 1A, 1B being further provided with means for selectively moving the movable contact between its first and second position, i.e. the housing 1 of FIGS. 2A, 2B is provided with a controllable actuator 16 for enabling bypassing of the compartment by means of a control signal. For this purpose, the housing 2 is provided with an actuator 16 in the form of a coil 16 operatively connectable to a control unit (not illustrated) for selectively bypassing the movable contact 7 into shortcircuiting the first 4A and second terminals 4B. The coil 16 provides a magnetic field which is controlled by the control signal, and affects the piston member 9 (in this case the bypass actuator 8 and movable contact 7), which is driven by the magnetic field. For enabling the piston member 9 to be driven by a magnetic field the piston member is at least partially made of a material having high magnetic permeability, such as steel. For good current conducting of the bypass switch, the piston member is partially made of a low resistivity material such as aluminium, for providing the movable contact 7. For example, a first part of the piston member 9 including the contact 7 is made of aluminium, whereas a second part of the piston member 9 including the bypass actuator 8 with explosion experiencing surface 10 is made of a steel material. Such an actuator with piston of aluminium and steel, and an actuator coil is a known constructional piece of equipment, often referred to as a Thompson coil or solenoid.

To securely hold the movable contact 7 in the second position, after an explosion has occurred, the movable contact or the bypass actuator 8 may be clamped in the second position, for example the contact surface 13 may be provided with contact springs arranged surrounding a cylindrical envelope surface of the movable contact 7.

As well as securing a good contact for the movable contact 7 in the second position, the contact mechanism is preferably provided to secure electric insulation in the first position, and for portions not intended to conduct electricity in the second position.

In FIGS. 1*a, b*, the movable contact 7 is provided as a piston and movable in a cylindrical channel in the housing 1. The cylindrical channel is provided with electrically insulating surfaces 21, 22 of an insulation material, which surfaces 21, 22 are arranged and positioned to surround the contact surfaces of the movable contact 7 in the first position. These contact surfaces (of 7) are provided as enveloping surfaces that are circumferentially arranged on the movable contact 7. The end surface 23 of the movable contact 7 piston is also provided with electrically insulating material 23, so that the end surface 23 that faces towards the contact surfaces 13 of the terminal bypass, which end surface 23 is arranged opposite the explosion facing end surface 10, isolates the movable contact from the contact surfaces 13 of the terminals 4A, 4B in the first position. An insulated guide 24 is provided in the end surface 23 of the movable contact 7.

In the second position (FIG. 1B), the contact surface of the movable contact 7 meets the contact surface 13 that are connected to the terminals 4A, 4B.

In FIGS. 2*a, b* the movable contact 7 is provided with similar circumferential and enveloping contact surfaces as in FIGS. 1*a, b*, and the end surface 23 of the movable contact 7 is provided with electrically insulating material so that the movable contact 7 in the unconnected first position (FIG. 2*a*) directs the insulated end surface 23 towards the contact surfaces 13 that are connected to the terminals 4A, 4B. As in FIGS. 1*a, b*, the cylindrical channel in the housing is provided with insulating surfaces 21, 22 positioned for surrounding the movable contact 7 in the first position. These isolating surfaces 21, 22 are, in the embodiments of FIGS. 2*a*, 2*b*, arranged to surround the bypass actuator 8 in the second position. In the embodiment of FIGS. 2*a*, 2*b*, an additional isolating surface 25, or portion, of the piston 7, 8 is provided between the movable contact section 7 and the bypass actuator section 8 of the piston 7, 8.

FIG. 1*a* also illustrates a further connection of each semiconductor device 3, 3A to an energy storage capacitor 100, by means of a third 4C and a fourth terminal 4D. A third terminal 4C provides a DC+ busbar and a fourth terminal 4D providing a DC− busbar. The third terminal 4C extends through the housing 1 to and from the energy storage capacitor 100, which capacitor is arranged outside the housing 1. The forth terminal 4*d* provides an extension of the second terminal 4B, to and from the capacitor 100. Each power semiconductor device 3, 3A can for example include a half-bridge comprising one semiconductor, especially the semiconductor devices 3, 3A and the capacitor 100 can be arranged in a bridge circuit of the same type illustrated in D3 by the submodule (7 in D3) in FIG. 2, wherein the capacitor is arranged outside the housing and the semiconductor half-bridge circuits are arranged inside the housing. Thus, the invention can be used to provide a bypass mechanism for such submodules. However, the main focus in this application is on the bypass mechanism, not he semiconductor circuits as such.

FIGS. 3 and 4 illustrate two embodiments of the housing according to the invention. The movement of the movable contact 7 is translatory in FIGS. 1 and 2, whereas the movement is rotational in FIGS. 3 and 4. The movable contact 7 is guided by means of an interior surface (13 in FIGS. 1 and 2) through the housing extending lengthwise of, and provides a the travelling direction for, the movable contact 7. The movable contacts 7 of FIGS. 3 and 4 is connected by means of respective hinges to the housing 1 so that the movable contact 7 is guided in a rotational movement from a disconnected first position into a second position interconnecting terminals, which terminals lead to and from an installed power semiconductor.

FIGS. 3A and 3B illustrates an embodiment in a disconnected state, wherein the movable contact is in its first position in FIG. 3A, and a bypassing state wherein the movable contact 7 interconnects to terminals 4A, and 4B. FIG. 3 illustrates a housing 1 including a compartment 2 wherein a power semiconductor 3 is installed on a mounting plate 15. The housing 1 includes a contact mechanism 6, which is installed inside the housing 1 in the compartment 2. Alternatively, the contact mechanism 6 may protrude through the housing 1 similar to the arrangements of FIGS. 1 and 2. A first and second terminal 4A, 4B leads into and out of the housing 1 and provides an input 4A and an output 4B for the power semiconductor 3. The contact mechanism 6 includes a bypass actuator including a surface 10 facing the power semiconductor 3 and guiding means 12, in the form of hinge connections between the movable contact 7 and the housing 1, for converting a explosion pressure received by the surface 10 into a rotational movement, by means of the hinges 12 and a connection (at 8) operatively connecting the surface 10 to the movable contact 7. The explosion pressure receiving surface 10 is an interior surface of an enclosure 17 that encapsulates the power semiconductor. This enclosure 17 is made in the form of a bag or box and made of a material that expands when subjected to the pressure created during explosion of the power semiconductor 3. The enclosure 17 is constructed to withstand the pressure being created if the power semiconductor 3, for which it is made, is totally destroyed in an explosion. Thus, the enclosure should be made in a material and a structure able to withstand an explosion that includes all energy available in the power semiconductor 3. It should also be dimensioned to expand so as to provide a movement for the movable contact 7 from its first to its second position, so that the movable contact 7 will reach the terminals 4A, 4B, even if the explosion is not a total exposition.

Moreover, the enclosure 17 provides an end for the movement by suitably being dimensioned to limit the expansion and thereby movement of the movable contact to a position where the movable contact has reached into its second contacting position.

The enclosure 17 may be made of a protective sheath similar to the protective casing of D7. It may be made of a Kevlar fabric.

FIG. 3 illustrate how an enclosure 17 expands upon a power semiconductor explodes and the bypass actuator 8 creates a rotational movement of the movable contact 7, it is however an alternatively preferably embodiment to convert the expanding motion of the enclosure 17 into a translational movement of a movable contact 7, in both cases the movement of the contact 7 is made to effectuate the bypass of the terminals of an exploding semiconductor 3.

FIGS. 4A, 4B illustrate another preferred embodiment wherein terminals 4A, 4B that provide input and output, respectively, of a power semiconductor 3 may be interconnected by means of a contact mechanism 8 moving from a first position in FIG. 4A into a second, bypassing, position in FIG. 4B. As in FIG. 3, the bypassing mechanism 8 provides a rotational movement of the movable contact 7, by means of hinges 12 that rotatable connects the movable contact 7 to the housing 1. The bypass actuator 8 is arranged to be pushed by a pressure wave from an exploding semiconductor 3 and has a surface facing the semiconductor 3. A pressure relief valve 14 is operatively connected to the bypass actuator 8. The pressure relief valve 14 is arranged so that when the movable contact 7 reaches its second position, the pressure relief valve reach a position wherein it release gas from the compartment to the surrounding environment. In this way the movement of the movable contact 7 is controlled and limited similar to the limitation provide by an enclosure, as illustrated by the enclosure 17 in the embodiment of FIG. 3.

A pressure relief valve may also suitably be installed in the embodiments illustrated in FIGS. 1 and 2 providing a further control to the movement of the movable contact 7 by providing a limit to the pressure in the compartment and thereby a limit to the driving force from the bypass actuator 8. In such arrangements the driving force experienced by the movable contact can be made to come to an end when the movable contact 7 reach its second position, or shortly after.

Figure 5:
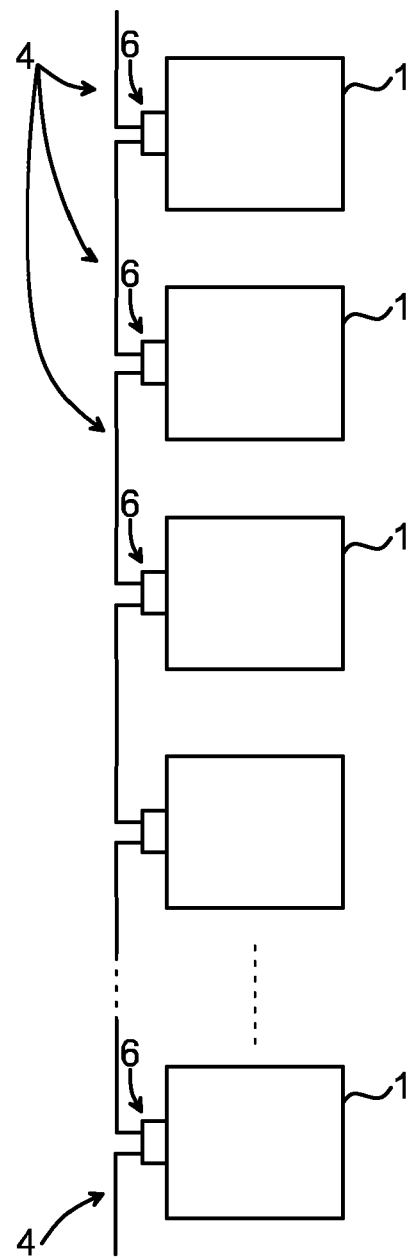
FIG. 5 illustrates a branch of a converter system in accordance with the present invention.

FIG. 5 illustrate housings 1 in the form of a plurality of substantially identical housing modules 1 arranged in a serial relationship by means of busbars 4. The busbars 4 are connected to terminals (4A, 4B) of each housing module 1. Each housing module 1 is provided with a respective contact mechanism 6, by means of which each respective housing module 1 may be bypassed as a consequence of a power semiconductor explosion inside the housing module 1. For these purpose each contact mechanism 6 comprises a movable contact and bypass actuator responsive to the explosion in accordance with the present invention, such as those exemplified in FIGS. 1-4.

The serially arranged housings 1 of FIG. 5 provide one branch of a three phase system having three such branches. Alternatively, the branch of FIG. 5 may be used in a converter for a one-phase system.

What is claimed is:

1. A housing for a power semiconductor, providing a compartment for installation of a power semiconductor, and comprising
a first and a second terminal, the terminals being arranged for connection of a power semiconductor installed in the compartment, and for leading current to and from the power semiconductor,
a contact mechanism for bypassing the compartment, the contact mechanism comprising at least one movable contact arranged for electrically connecting the first and second terminal, the at least one movable contact being movable between a disconnected first position and a connected second position, in which second position the movable contact connects the terminals,
the contact mechanism further comprising a bypass actuator arranged inside the compartment and provided for transforming a pressure from an exploding power semiconductor into motion, the bypass actuator being operatively connected to the movable contact and arranged to move the movable contact from the first to the second position when subjected to the pressure of an exploding power semiconductor.

2. The housing according to claim 1, wherein the connection between the terminals and the movable contact, includes clamping means, such as springs, for holding the movable contact in the second position.

3. The housing according to claim 1, the contact mechanism further comprising an actuator for moving the movable contact between the first and the second positions, the actuator being a signal controlled actuator.

4. The housing according to claim 3, the signal controlled actuator being an electromagnetic actuator controlled by an electric signal.

5. The housing according to claim 1, wherein the movable contact is arranged to connect to the terminals outside of the housing.

6. The housing according to claim 1, the contact mechanism including a piston member and wherein the bypass actuator includes a surface at the end of the piston member, which surface faces the power semiconductor.

7. The housing according to claim 6, the piston member extending or being arranged to move through the housing.

8. The housing according to claim 1, including a pressure relief valve arranged for selectively releasing gas from the compartment.

9. The housing according to claim 8, wherein the contact mechanism is operatively connected to the pressure relief valve and arranged for opening the pressure relief valve when the contact mechanism connects to the terminals.

10. The housing according to claim 1, the bypass actuator comprising an enclosure for the power semiconductor, which enclosure is adapted for being arranged to encapsulate the power semiconductor inside the compartment.

11. The housing according to claim 10, the enclosure consisting of an expandable material and being adapted for structural expansion when subjected to the pressure from an exploding power semiconductor.

12. The housing according to claim 1, further comprising at least one guiding element for controlling the movement of the movable contact, such as a hinge controlling a rotational movement of the movable contact, or an elongated element controlling a translational movement of the movable contact.

13. An electric power converting system comprising a plurality of housings in accordance with claim 1, arranged in series.

14. The electric power converting system according to claim 13, comprising three branches of the serially arranged housings.

* * * * *